US012761104B2

(12) United States Patent
Farkas et al.

(10) Patent No.: US 12,761,104 B2
(45) Date of Patent: Oct. 13, 2026

(54) OPTICAL LEAK DETECTION USING COLOR SENSOR

(71) Applicant: DELL PRODUCTS L.P., Round Rock, TX (US)

(72) Inventors: Sandor Farkas, Round Rock, TX (US); Michael Stumpf, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 26 days.

(21) Appl. No.: 18/820,714

(22) Filed: Aug. 30, 2024

(65) Prior Publication Data

US 2026/0063497 A1 Mar. 5, 2026

(51) Int. Cl.
*G01M 3/20* (2006.01)
*H05K 7/20* (2006.01)

(52) U.S. Cl.
CPC .......... *G01M 3/20* (2013.01); *H05K 7/20272* (2013.01); *H05K 7/20781* (2013.01)

(58) Field of Classification Search
CPC .. G01M 3/20; H05K 7/20272; H05K 7/20781
USPC .......................................................... 356/402
See application file for complete search history.

(56) References Cited

U.S. PATENT DOCUMENTS 7,566,182 B2 * 7/2009 Atkinson ........... G03G 15/5075 400/76
2002/0080245 A1 * 6/2002 Parulski ................. H04N 23/88 348/333.01
2002/0118967 A1 * 8/2002 Funston ................. G03B 15/05 396/155
2005/0200686 A1 * 9/2005 Silverbrook ............... B41J 3/46 347/109
2005/0200687 A1 * 9/2005 Silverbrook ............... B41J 3/36 358/1.15
2005/0200688 A1 * 9/2005 Silverbrook ......... B41J 2/04543 347/109
2006/0146330 A1 * 7/2006 Maniam .................. G01J 3/513 356/419
2008/0198551 A1 * 8/2008 Hoss ..................... H10W 40/00 361/702
2020/0348202 A1 11/2020 Farkas et al.
2021/0320490 A1 10/2021 Lin et al.
2022/0291072 A1 * 9/2022 Stumpf .............. H05K 7/20272

* cited by examiner

*Primary Examiner* — Md M Rahman
(74) *Attorney, Agent, or Firm* — Larson Newman, LLP

(57) ABSTRACT

An optical detector for use within a chassis of an information handling system includes an internal illuminator, photodetector, and signal processor. The internal illuminator is configured to emit light to illuminate an object within a predetermined region of the chassis of the information handling system. The photodetector is configured to absorb the light across a color spectrum in response to the light being reflected from the object and to convert the light into an electrical signal. The signal processor is communicatively coupled with the photodetector and is configured to convert the electrical signal into coordinates of a predefined color space. The coordinates of the color space correspond to the color of the object. The signal processor is configured to identify the object in response to the coordinates matching a predetermined set of coordinates associated with the object.

18 Claims, 7 Drawing Sheets

200

OPTICAL LEAK DETECTION USING COLOR SENSOR

FIELD OF THE DISCLOSURE

The present disclosure generally relates to information handling systems, and more particularly relates to optical leak detection of liquid coolant in an information handling system.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus, information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems.

Information handling systems can also implement various virtualized architectures. Data and voice communications among information handling systems may be via networks that are wired, wireless, or some combination.

SUMMARY

An optical detector for use within a chassis of an information handling system includes an internal illuminator, photodetector, and signal processor. The internal illuminator is configured to emit light to illuminate an object within a predetermined region of the chassis of the information handling system. The photodetector is configured to absorb the light across a color spectrum in response to the light being reflected from the object and to convert the light into an electrical signal. The signal processor is communicatively coupled with the photodetector and is configured to convert the electrical signal into coordinates of a predefined color space. The coordinates of the color space correspond to the color of the object. The signal processor is configured to identify the object in response to the coordinates matching a predetermined set of coordinates associated with the object.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Figure 1:
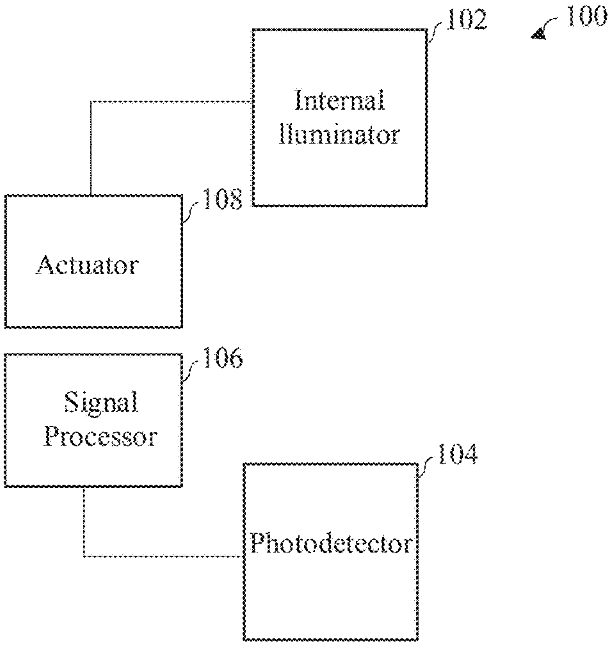
FIG. 1 is a block diagram of an optical leak detector according to an embodiment of the present disclosure.

FIG. 1 illustrates optical detector 100 capable of detecting a coolant leak within an information handling system according to an embodiment of the present disclosure. Optical detector 100 illustratively includes internal illuminator 102, photodetector 104, and signal processor 106 communicatively coupled to photodetector 104. In certain embodiments, optical detector 100 may also include actuator 108. Optical detector 100, in certain arrangements, may be integrated into the motherboard of an information handling system. In other arrangements, optical detector 100 may be a stand-alone device that connects internally to an information handling system, for example by connecting to an internal partition, side region, cover, or other part of the information handling system.

For purposes of this disclosure, an information handling system is one that includes a liquid cooling apparatus or sub-system. Such an information handling system can include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, such an information handling system may be a personal computer (such as a desktop or laptop), server (such as a blade server or rack server), a network storage device, or any other suitable device and may vary in size, shape, performance, functionality, and price. The information handling system may include random access memory (RAM), one or more processing resources such as a central processing unit (CPU), graphics processing unit (GPU), hardware and/or software control logic, as well as ROM and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components.

Figure 2:
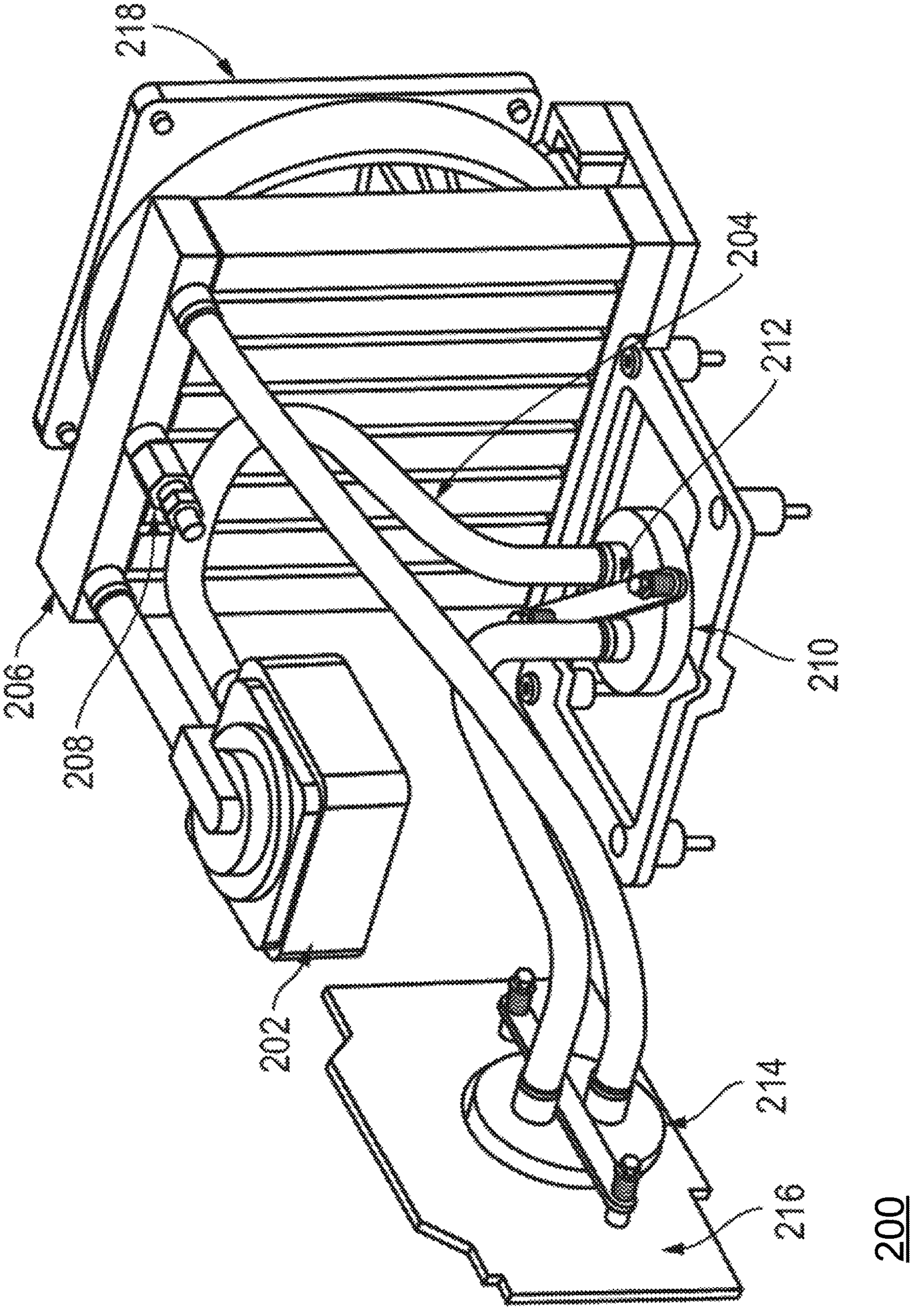
FIG. 2 is perspective view of an example liquid cooling system that may be monitored for leakage by the optical detector of FIG. 1 according to an embodiment of the present disclosure.

As the processing power of information handling systems continues to increase, the use of liquid cooling is expected to become more common owing to certain advantages that liquid cooling offers over other types of cooling. Referring to FIG. 2, an example liquid cooling system 200 is illustrated. Liquid cooling system 200 illustratively includes pump 202, tubing 204, heat exchanger 206, coolant port 208, CPU cold plate 210, clamp 212, GPU cold plate 214, memory heatsink 216, and fan 218. Pump 202 circulates a coolant such as water or other liquid (e.g., water plus additives) through tubing 204 and heat exchanger 206 to the components of the information handling system, including memory, CPU and/or GPU, as well as other components. The coolant circulates coolant—absorbing heat from the components and cooling the components via the cold plates—in a closed loop within the housing of the information handling system.

Notwithstanding the advantages of liquid cooling, there is the possibility that one or more components of the liquid cooling system may develop leaks over time due to vibration, thermal cycles, aging, misalignment of heat exchangers or cold plates, or the like. Any leak that exposes the components of the information handling system to liquid can cause corrosion or damage to the circuitry within the system's housing. In certain arrangements, a leak occurring in one information handling system also may damage one or more nearby information handling systems if the systems are sufficiently close to one another. For example, a leak may occur in one of multiple servers stacked on a vertical rack (an increasingly common configuration). If the leak is not detected early enough, the coolant may spill out of one server and adversely affect one or more servers below it on the vertical rack.

Referring again to FIG. 1, leak detector 100 detects a potential leak within an information handling system based on the information conveyed by the nature of the light detected by photodetector 104 when light emitted by internal illuminator 102 is reflected to the photodetector. In certain embodiments, internal illuminator 102 includes one or more light emitting diodes (LEDs). The light emitted by internal illuminator 102 may have a specific wavelength or may form a spectrum of light having different frequencies and corresponding wavelengths. In certain embodiments, the emitted light is specifically ultraviolet (UV) light. The coolant of a liquid cooling apparatus or subsystem used by the information handling system may be infused with a fluorescent dye detectable by photodetector 104. Actuator 108, included in certain embodiments, may intermittently activate internal illuminator 102, causing the internal illuminator to emit pulses of light in a predetermined pattern. In other embodiments, actuator 108 may cause internal illuminator 102 to emit a constant light emission.

Photodetector 104 includes one or more photodetectors, such as an array of photodiodes that are sensitive to different wavelengths of light and that are configured to determine color based on the ratio of reflected RGB light. In accordance with some embodiments, photodetector 104 can include RGB filters that capture the intensity of the primary colors, such that the combined data determines the color of the light. In other embodiments, photodetector 104 includes multiple, stacked photodetectors in which each layer is sensitive to a specific color. Photodetector 104, according to yet other embodiments, includes plasmonic grating that differentiates between light wavelengths and directs specific light colors into specific photodetectors without filtering.

Operatively, photodetector 104 is configured to absorb light across a color spectrum in response to the light being reflected from an object within the chassis of an information handling system. The object, for example, may be a CPU, GPU, memory, power supply unit, DIMM latch, internal wall of the chassis, or other component of the information handling system. The components may be part of a printed circuit board with expansion capabilities that makes up a motherboard or mainboard of the information handling system, or the object may be an internal portion of the information handling system's chassis. The object may be an extraneous or foreign object. Of specific interest is an object formed by a collection of liquid coolant leaked from a liquid cooling apparatus or subsystem of the information handling system. Photodetector 104 converts the light reflected from an object into an electrical signal and conveys the electrical signal to signal processor 106 for processing.

Optical detector 100, by virtue of sensing color of the reflected light offers advantages over conventional detectors such as a green-optimized photodiode (PD). The PD typically requires high gain circuitry given that it must operate with respect to signals whose amplitudes are usually in a nano-range level. High gain, however, tends to cause saturation if the absorbed, reflected light is too strong and can also amplify noise, thus requiring hardware and/or firmware filtering. The PD only senses light intensity of one range of wavelengths centered around 560 nm and is thus usually not able to identify an actual color. Accordingly, there is a likelihood of PD ultraviolet (UV) leakage. UV leakage is unwanted UV light that reaches the PD. The PD sees part of the UV leakage as incoming light because the PD's UV rejection is not perfect. Fluorescence from extraneous objects within the chassis may give rise to a false positive that erroneously indicates a coolant leak. By contrast, optical detector 100 is a color-based sensing apparatus that uses the color spectrum to offer higher dynamic range, higher sensitivity, enhanced linearity and better noise rejection. Specifically, the expanded spectral components obtained and analyzed by optical detector 100 provide an added source of information for identifying objects within the information handling system based on the color of the objects, especially an object formed by a collection of liquid coolant infused with a dye that fluoresces in response to light of a specific type (e.g., UV light).

Figure 3:
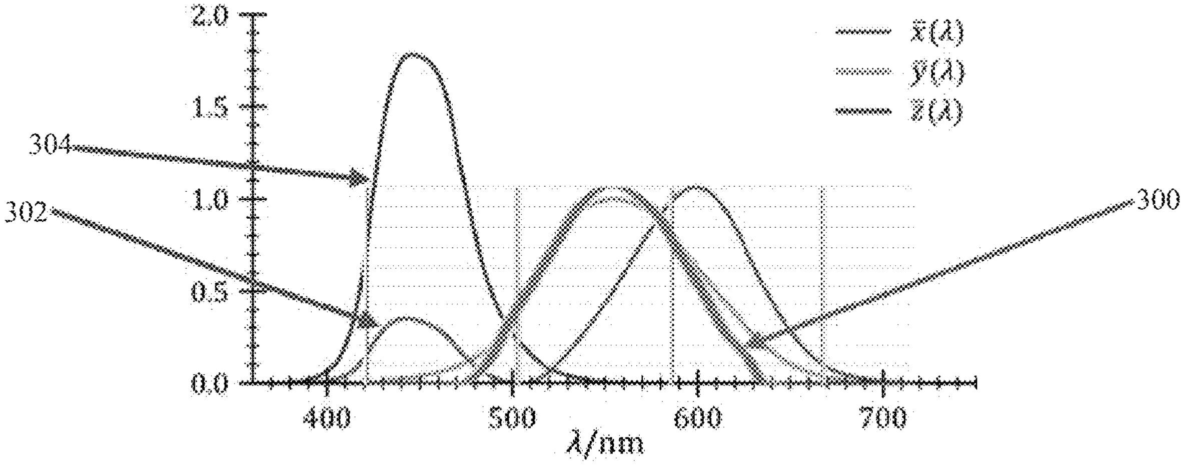
FIG. 3 is a graph of spectral components obtained and utilized by an optical detector according to an embodiment of the present disclosure.

FIG. 3 is a graph showing the enhanced spectral components utilized by optical detector 100. The horizontal axis measures the wavelengths $\lambda$ of colors of light as determined by signal processor 106 based on electrical signals generated by photodetector 104 in response to reflected light. The vertical axis are coordinates from the CIE XYZ color space, a device-invariant representation of color developed by the International Commission on Illumination and encompassing all colors visible to a human being with average eyesight. The curves correspond to the primary colors indicated.

Curve 300 is the green-optimized PD response (magnitude not to scale). Note that curve 300 approximates $\bar{y}(\lambda)$ as determined and utilized by optical detector 100. Optical detector 100, however, is configured to additionally determine and utilize the added spectral components $\bar{x}(\lambda)$ and $\bar{z}(\lambda)$, represented by curves 302 and 304, respectively. The additional spectral components provide additional information used by optical detector 100 to make full-spectrum aware determinations as described herein.

In certain embodiments, photodetector 104 includes sensors (e.g., array of color-specific photodiodes) for the three distinct channels X, Y, and Z, corresponding to spectral components $\bar{x}(\lambda)$, $\bar{y}(\lambda)$, and $\bar{z}(\lambda)$, respectively, as well as a further one for a W (white light) channel. Incorporating the additional information obtained from the separate channels enables optical detector 100 to obtain added information provided by the additional other spectral components $\bar{x}(\lambda)$, $\bar{y}(\lambda)$, and $\bar{z}(\lambda)$. Optical detector 100, as explained in greater detail below, determines if an object reflecting the light came from an object formed by a collection of liquid coolant leaked from a liquid cooling system or from some other object serving as a source of reflected light.

The W channel is not necessary for leak detection but is more sensitive than the XYZ channels. Accordingly, though not necessary for leak detection, the W channel nonetheless is a significant source of additional information. The W channel provides a strong response to UV light less than 400 nm, while the XYZ channels provide only a low response. The W channel also provides a strong response to infrared (IR) light greater than 700 nm, while the XYZ channels provide only a low response. Sensing of the four channels with photodetector 104 enables optical detector 100 to make a full-spectrum decision regarding the identity of an object illuminated by internal illuminator 102. In certain embodiments, photodetector 104 is configured to monitor the XYZW channels while rejecting non-correlated light and responding only to correlated light. Reflected correlated light absorbed by photodetector 104 may have one of three sources: (1) reflection of light (e.g., UV light) emitted by internal illuminator 102 itself; (2) light reflected from either an information handling system component (e.g., DIMM latch) or an extraneous object (e.g., bug); or (3) fluorescence due to a coolant leak within the chassis of the information handling system. Optical detector 100 uses the information from the XYZW channels to distinguish among the sources and to recognize whether the object reflecting light emitted by internal illuminator 102 and absorbed by photodetector 104 is likely a collection of coolant leaked from a liquid cooling system within the chassis of the information handling system.

Optical detector is configured to make the determination based on signal processor 106's handling of electrical signals generated by photodetector 104 in response to absorbing the reflected light. Signal processor 106 is configured to convert the electrical signals into coordinates of a predefined color space. Conversion to the predefined color space enables transformation from three variables of a 3D space to only two variables of a 2D space. 2D space is more readily visualized, and specific areas within a planar 2D space are more readily detected than volumes in 3D space. The predefined color space, in certain embodiments, may be the color space defined by the CIE, which is used in the description herein for illustrative purposes. In other embodiments, however, any other predefined color space may be used. Regardless of which color space is used, the color space is one that provides coordinates that correspond to color. That is, specific coordinates provide a kind of signature indicating a particular color, either a primary color or a combination of colors. Signal processor 106 is configured to identify certain objects in response to the object's color coordinates matching a predetermined set of coordinates associated with the object. For example, the coordinates corresponding to the fluorescence of a dye added to the coolant used in a liquid cooling system can be predetermined to correspond to the dye-infused coolant. Accordingly, a potential leak is detected by optical detector 100 if the coordinates determined by signal processor 106 based on light absorbed by photodetector 104 match the coordinates corresponding to the fluorescence of the dye added to the coolant.

Figure 4:
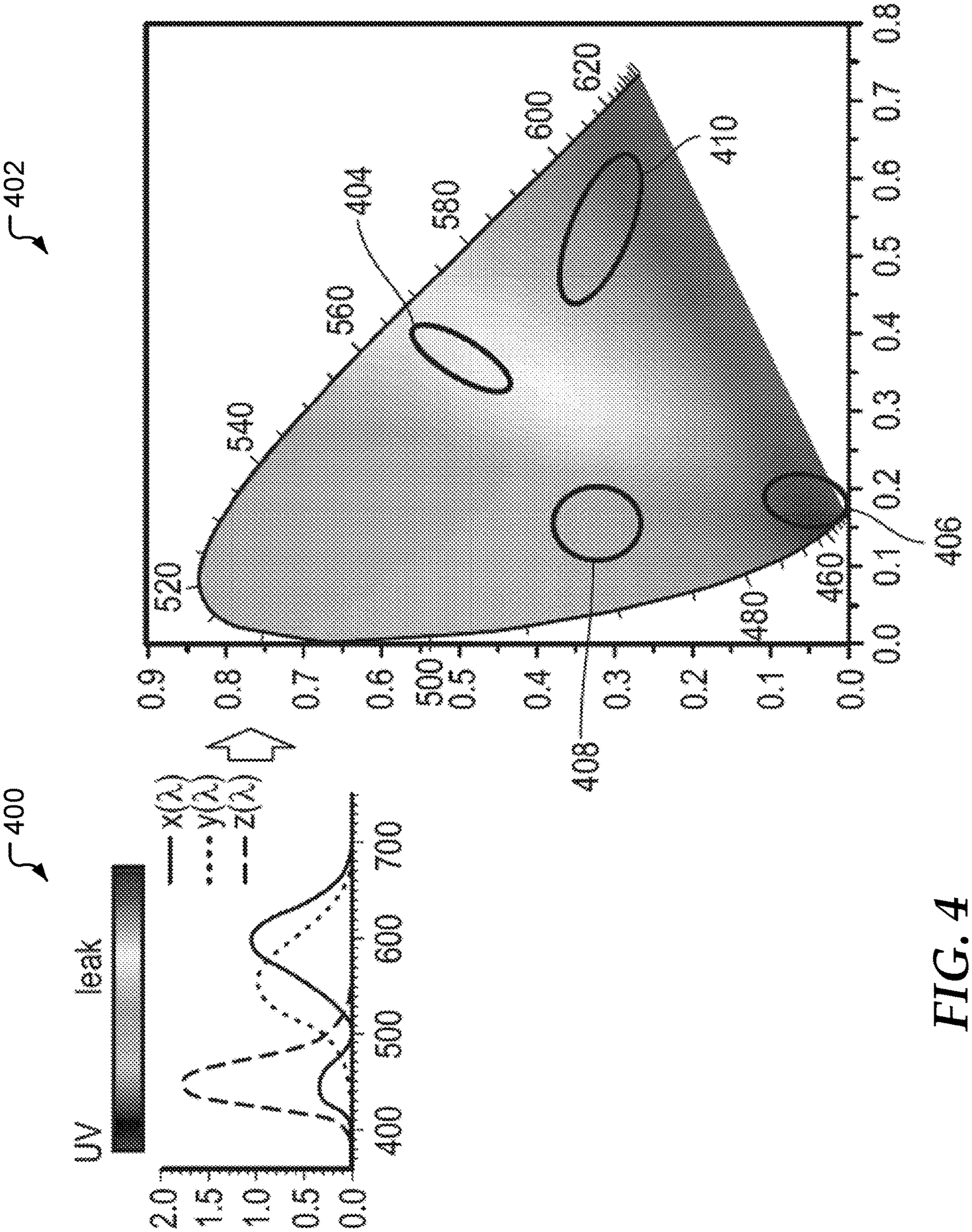
FIG. 4 illustrates a conversion of spectral components to color coordinates using a color matching function implemented by an optical detector according to an embodiment of the present disclosure.

FIG. 4 illustrates the procedure performed by signal processor 106. Graph 400 depicts the spectral range of colors of light absorbed by photodetector 104. Signal processor 106 converts the light-responsive electrical signals received from photodetector 104 into coordinates of color space 402. Color space 402 is illustratively a two-dimensional space. Different points in color space 402 correspond to colors that match a predetermined group of objects, including points within region 404 which correspond to the fluorescence of a dye added to the coolant used in a liquid cooling system. Coordinates of points within region 406 correspond to the residual light (e.g., UV light) of internal illuminator 102 reflected from surfaces of the housing of the information handling system. Coordinates of points within region 408 correspond to one or more extraneous objects (e.g., bug) within the housing, whereas those of points within region 410 correspond to components normally included within the housing and thus not of concern. In some embodiments, a predetermined set of coordinates corresponding to colors identifying specific objects (e.g., collection of leaked coolant) can be stored in a memory integrated in, or coupled with, optical detector 100. Thus, using full-spectrum information, optical detector 100 can distinguish a coolant leak from other objects or sources of light. For example, optical detector 100 can distinguish between coolant leakage and ambient light, which may assist in correcting issues related to placement of optical detector 100. Specifically, optical detector 100 can identify an object that is a liquid collection of coolant, the identifying based on the color coordinates of a dye that fluoresces in response to light emitted by internal illuminator 102.

Low-light optical sensors are inherently slow because photons must be collected over a relatively long-time interval. At the same time, it is desired that leak detection occurs with low latency. Certain embodiments implement two distinct techniques—half-period measurement and truncated-cycle measurement—to accelerate the measurement process and overcome the challenges.

Figure 5:
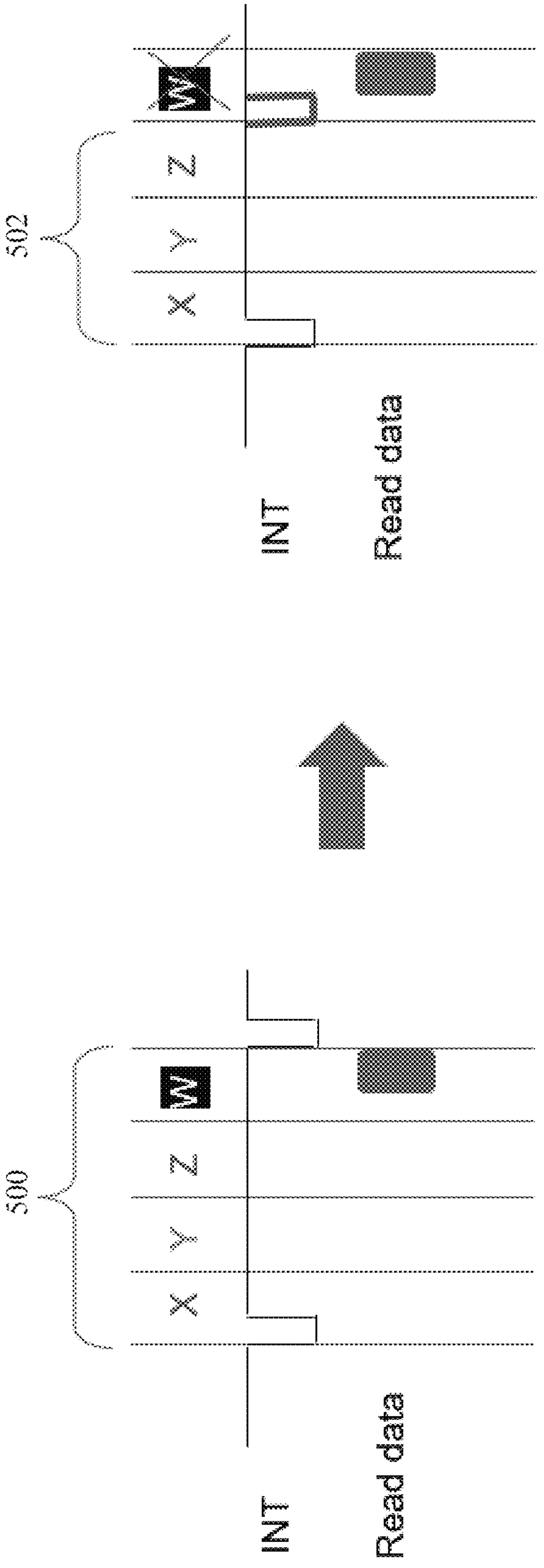
FIG. 5 illustrates an example curtailed-cycle procedure performed by an optical detector according to an embodiment of the present disclosure.

In certain embodiments, the speed with which optical detector 100 makes the determination is enhanced by truncating the cycle in which XYZW channels are measured. For example, if four back-to-back measurements are made per cycle-every cycle measuring each of the XYZW channels in that order starting with X, proceeding to Y, then to Z, and finally to W-then the determination is more rapidly made if the dye of the coolant can be identified using only the XYZ channels. FIG. 5 illustrates curtailing the cycle when photodetector 104 and signal processor 106 communicate via an I2C serial communication bus, the XYZW-ordered cycle of measurement 500 being initiated by a falling interrupt (INT) signal, as shown in FIG. 5. Signal processor 106, in some embodiments, is configured to detect the end of each channel measurement by polling the I2C rolling counter register that increments after each color conversion is completed. If the presence of the dye can be detected based on only coordinates derived from the XYZ channels, then signal processor 106 uses a truncated cycle, illustrated by cycle 502 in which the W channel is skipped, thereby reducing the cycle time by 25 percent. Signal processor 106 may monitor the I2C counter and status registers to restart a cycle once the desired channels are ready.

Figure 6:
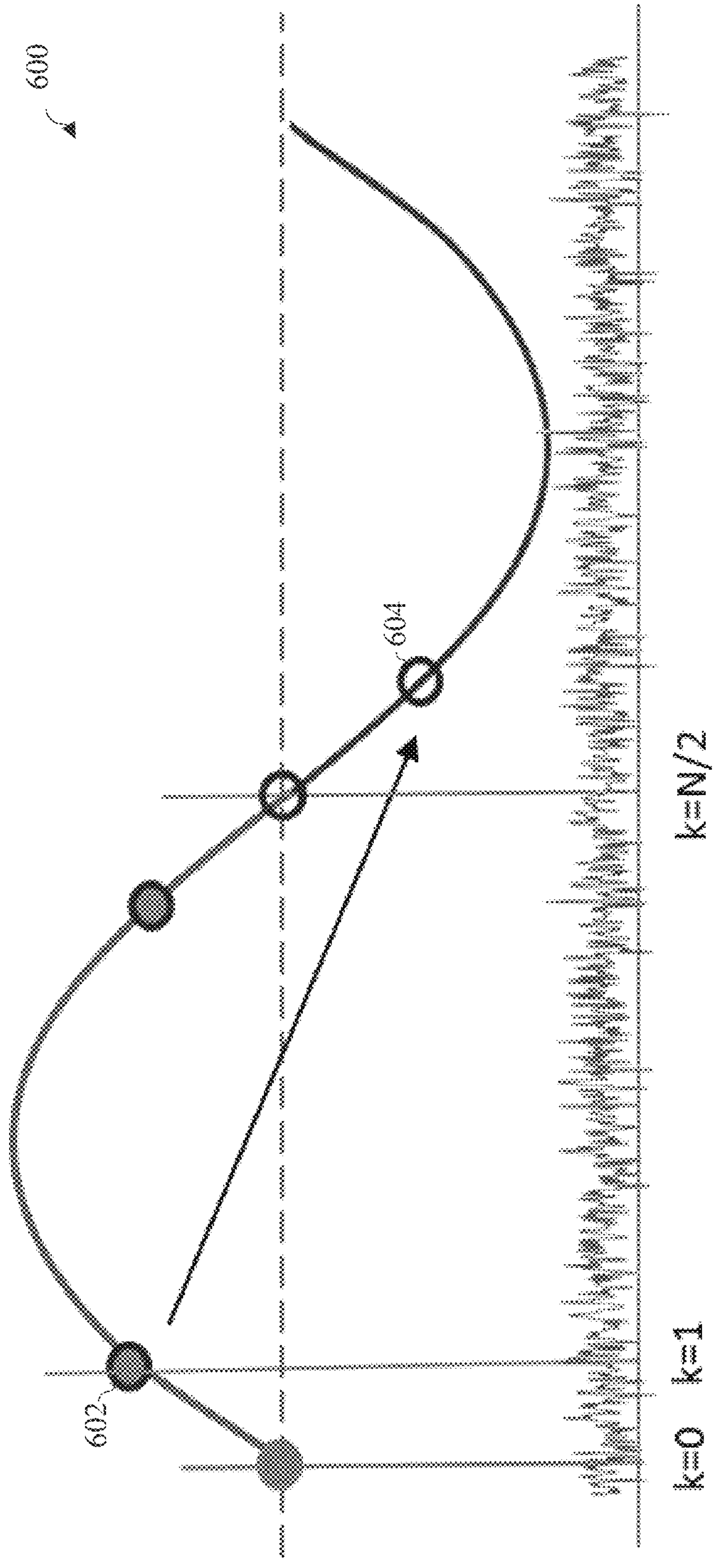
FIG. 6 illustrates an example half-cycle approximation performed by an optical detector according to an embodiment of the present disclosure.

In other embodiments, the speed with which optical detector 100 determines whether a potential coolant leak has occurred is enhanced by using a half-cycle approximation as illustrated in FIG. 6. Signal processor 106 samples the electrical signals received from photodetector 104 to generate N discrete samples but does so by only taking N/2 physical samples per cycle of the electrical signal and estimating N minus N/2 additional samples. To estimate the N minus N/2 additional samples, signal processor 106 takes advantage of the perfect, or approximate, symmetry of the sinusoidal waveform of the electrical signals. For example, relative to a midline, sample 604 is the same, or nearly the same, as sample 602 of sinusoidal waveform 600, albeit reversed relative to the midline. By taking only N/2 physical samples during the first half of the cycle and using the physical samples to estimate N minus N/2 additional samples whose orientations relative the midline are reversed, signal processor 106 generates N samples of sinusoidal waveform 600 based on only N/2 actual samples. By implementing the procedure, signal processor 106 halves the sampling time.

Figure 7:
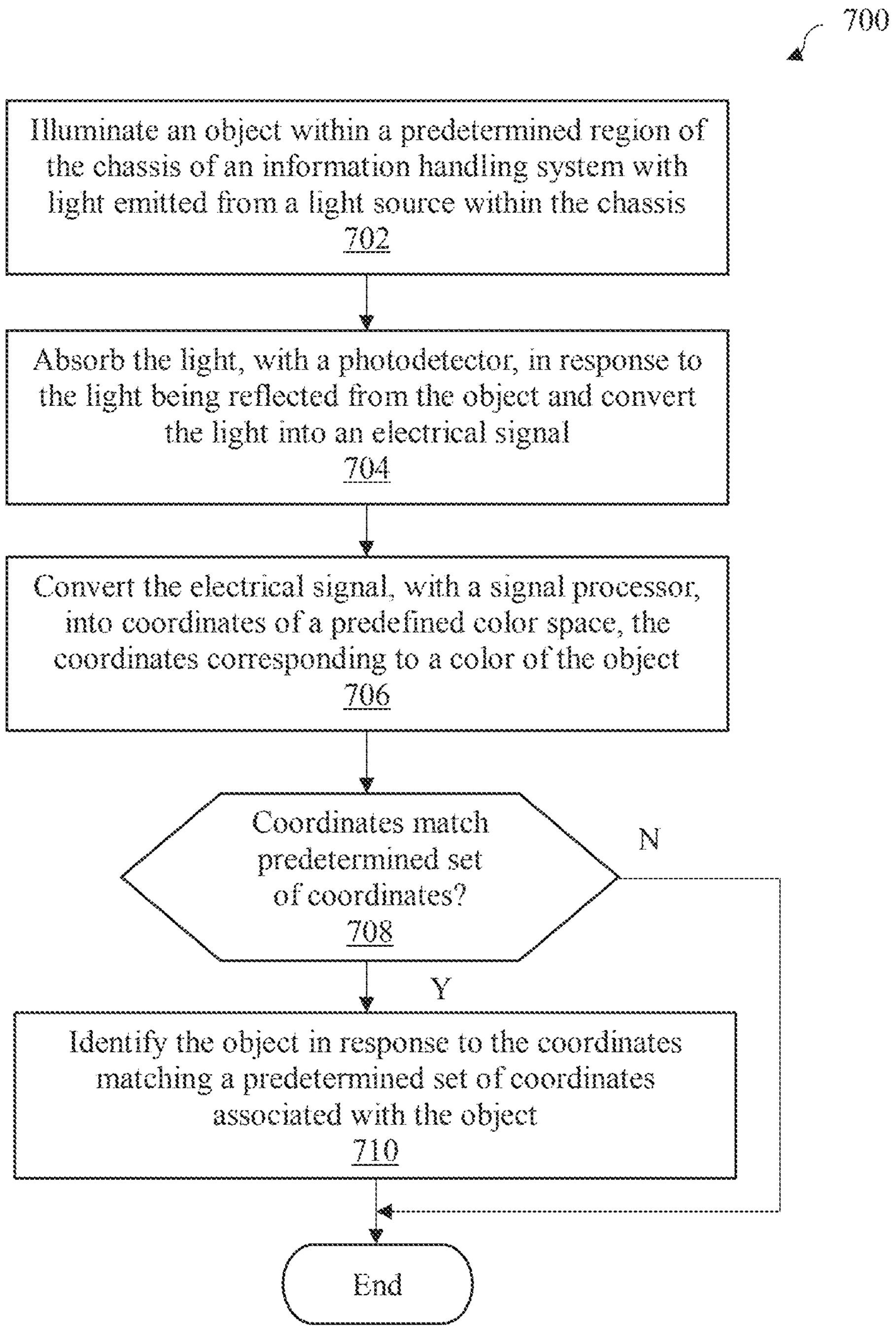
FIG. 7 is a flow diagram of a method for color-based identification of objects within a chassis of an information handling system according to an embodiment of the present disclosure.

FIG. 7 illustrates method 700, a method beginning at block 702 for performing a color-based identification of objects within a chassis of an information handling system according to an embodiment of the present disclosure. It will be readily appreciated that not every method step set forth in this flow diagram is always necessary, and that certain steps of the methods may be combined, performed simultaneously, in a different order, or perhaps omitted, without varying from the scope of the disclosure. Method 700 may be performed by an optical detector having certain features of optical detector 100 described with reference to FIGS. 1-6.

At block 702, the optical detector illuminates an object within a predetermined region of the chassis of an information handling system, the illumination provided by light (e.g., UV light) emitted from a light source within the chassis. A photodetector, at block 704, absorbs the light when the light is reflected from the object. The light is converted by the photodetector into an electrical signal that the photodetector transmits to a signal processor. At block 706, the signal processor converts the electrical signal into coordinates of a predefined color space. The color space may be the color space defined by the CIE or another predefined color space. The signal processor determines at block 708 whether the coordinates generated based on the electrical signals received from the photodetector match a predetermined set of coordinates. If the coordinates match a predetermined set of coordinates, then at block 710, the optical detector identifies the object based on the matching coordinates being associated with the object.

For example, the matching coordinates may correspond to a dye infused in a coolant that fluoresces in response to light (e.g., UV light). Thus, the optical detector can identify the object as a liquid collection of leaked coolant, indicating a potential leak originating in the liquid cooling apparatus or subsystem used to cool the information handling system. That is, the potential leak is identified by the color coordinates matching coordinates associated with a fluorescent dye added to a coolant circulated by the liquid cooling apparatus or subsystem.

In some embodiments, method 700 is performed using a signal processor that measures multiple color channels, such as the XYZ channels corresponding to different colors detected, for example, by a photodetector formed as an array of photodiodes. In monitoring for potential coolant leaks, the signal processor may monitor an I2C counter and status register and curtail a current cycle once measurement of the XYZ channels is complete. The signal processor may initiate a new cycle after measurement of the XYZ channels is complete, thereby eliminating the time needed to also measure the W channel.

The signal processor may analyze the electrical signal by sampling the electrical signal and performing digital signal processing of the samples generated. In certain embodiments, the signal processor generates N samples per cycle of the electrical signal. The signal processor may generate the N samples by taking N/2 physical samples of the electrical signal and using the physical samples to estimate N minus N/2 additional samples, reversing the samples'orientation relative to a midline.

In certain embodiments, method 700 is performed using an optical detector having a photodetector that rejects signals corresponding to non-correlated light and responds to signals corresponding to correlated light. In some embodiments, the optical detector distinguishes between reflected UV light and fluorescence of a dye added to a coolant used by a liquid cooling system. The optical detector used to perform method 700, in still other embodiments, distinguishes between ambient light and the fluorescence of the dye added to a coolant.

Figure 8:
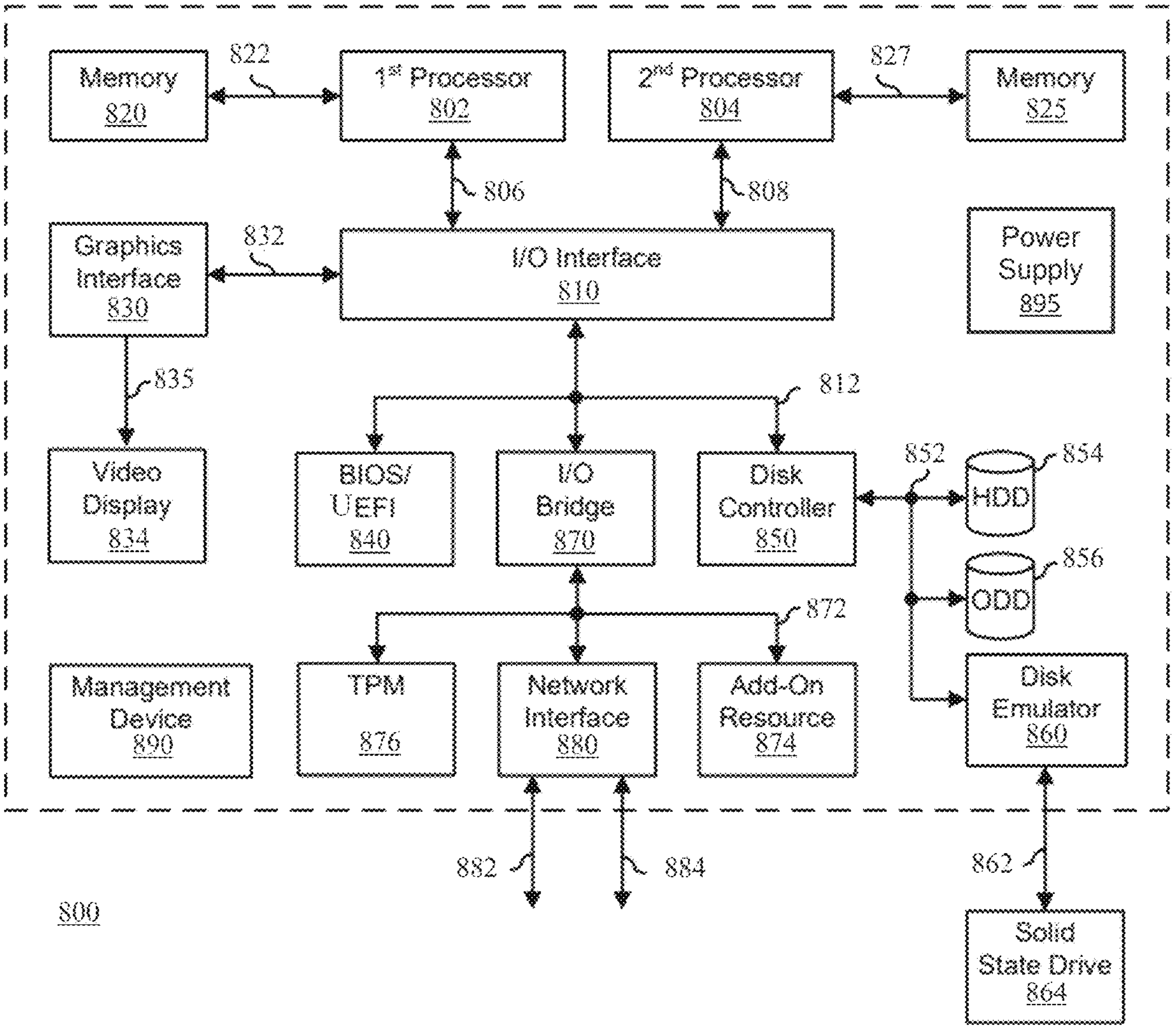
FIG. 8 is a block diagram of a general information handling system according to an embodiment of the present disclosure.

FIG. 8 shows a generalized embodiment of an information handling system 800 according to an embodiment of the present disclosure. Information handling system 800 may be substantially like one having a liquid cooling subsystem that is monitored by optical detector 100 described with reference to FIGS. 1-6. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 800 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 800 can include processing resources for executing machine-executable code, such as a central processing unit (CPU), a programmable logic array (PLA), an embedded device such as a System-on-a-Chip (SoC), or other control logic hardware. Information handling system 800 can also include one or more computer-readable medium for storing machine-executable code, such as software or data. Additional components of information handling system 800 can include one or more storage devices that can store machine-executable code, one or more communications ports for communicating with external devices, and various input and output (I/O) devices, such as a keyboard, a mouse, and a video display. Information handling system 800 can also include one or more buses operable to transmit information between the various hardware components.

Information handling system 800 can include devices or modules that embody one or more of the devices or modules described below and operates to perform one or more of the methods described below. Information handling system 800 includes a processors 802 and 804, an input/output (I/O) interface 810, memories 820 and 825, a graphics interface 830, a basic input and output system/universal extensible firmware interface (BIOS/UEFI) module 840, a disk controller 850, a hard disk drive (HDD) 854, an optical disk drive (ODD) 856, a disk emulator 860 connected to an external solid state drive (SSD) 864, an I/O bridge 870, one or more add-on resources 874, a trusted platform module (TPM) 876, a network interface 880, a management device 890, and a power supply 895. Processors 802 and 804, I/O interface 810, memory 820, graphics interface 830, BIOS/UEFI module 840, disk controller 850, HDD 854, ODD 856, disk emulator 860, SSD 864, I/O bridge 870, add-on resources 874, TPM 876, and network interface 880 operate together to provide a host environment of information handling system 800 that operates to provide the data processing functionality of the information handling system. The host environment operates to execute machine-executable code, including platform BIOS/UEFI code, device firmware, operating system code, applications, programs, and the like, to perform the data processing tasks associated with information handling system 800.

In the host environment, processor 802 is connected to I/O interface 810 via processor interface 806, and processor 804 is connected to the I/O interface via processor interface 808. Memory 820 is connected to processor 802 via a memory interface 822. Memory 825 is connected to processor 804 via a memory interface 827. Graphics interface 830 is connected to I/O interface 810 via a graphics interface 832 and provides a video display output 836 to a video display 834. In a particular embodiment, information handling system 800 includes separate memories that are dedicated to each of processors 802 and 804 via separate memory interfaces. An example of memories 820 and 830 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 840, disk controller 850, and I/O bridge 870 are connected to I/O interface 810 via an I/O channel 812. An example of I/O channel 812 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 810 can also include one or more other I/O interfaces, including an Industry Standard Architecture (ISA) interface, a Small Computer Serial Interface (SCSI) interface, an Inter-Integrated Circuit (I2C) interface, a System Packet Interface (SPI), a Universal Serial Bus (USB), another interface, or a combination thereof. BIOS/UEFI module 840 includes BIOS/UEFI code operable to detect resources within information handling system 800, to provide drivers for the resources, initialize the resources, and access the resources. BIOS/UEFI module 840 includes code that operates to detect resources within information handling system 800, to provide drivers for the resources, to initialize the resources, and to access the resources.

Disk controller 850 includes a disk interface 852 that connects the disk controller to HDD 854, to ODD 856, and to disk emulator 860. An example of disk interface 852 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 860 permits SSD 864 to be connected to information handling system 800 via an external interface 862. An example of external interface 862 includes a USB interface, an IEEE 4394 (Firewire) interface, a proprietary interface, or a combination thereof. Alternatively, solid-state drive 864 can be disposed within information handling system 800.

I/O bridge 870 includes a peripheral interface 872 that connects the I/O bridge to add-on resource 874, to TPM 876, and to network interface 880. Peripheral interface 872 can be the same type of interface as I/O channel 812 or can be a different type of interface. As such, I/O bridge 870 extends the capacity of I/O channel 812 when peripheral interface 872 and the I/O channel are of the same type, and the I/O bridge translates information from a format suitable to the I/O channel to a format suitable to the peripheral channel 872 when they are of a different type. Add-on resource 874 can include a data storage system, an additional graphics interface, a network interface card (NIC), a sound/video processing card, another add-on resource, or a combination thereof. Add-on resource 874 can be on a main circuit board, on separate circuit board or add-in card disposed within information handling system 800, a device that is external to the information handling system, or a combination thereof.

Network interface 880 represents a NIC disposed within information handling system 800, on a main circuit board of the information handling system, integrated onto another component such as I/O interface 810, in another suitable location, or a combination thereof. Network interface device 880 includes network channels 882 and 884 that provide interfaces to devices that are external to information handling system 800. In a particular embodiment, network channels 882 and 884 are of a different type than peripheral channel 872 and network interface 880 translates information from a format suitable to the peripheral channel to a format suitable to external devices. An example of network channels 882 and 884 includes InfiniBand channels, Fibre Channel channels, Gigabit Ethernet channels, proprietary channel architectures, or a combination thereof. Network channels 882 and 884 can be connected to external network resources (not illustrated). The network resource can include another information handling system, a data storage system, another network, a grid management system, another suitable resource, or a combination thereof.

Management device 890 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 800. In particular, management device 890 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 800, such as system cooling fans and power supplies. Management device 890 can include a network connection to an external management system, and the management device can communicate with the management system to report status information for information handling system 800, to receive BIOS/UEFI or system firmware updates, or to perform other task for managing and controlling the operation of information handling system 800.

Management device 890 can operate off a separate power plane from the components of the host environment so that the management device receives power to manage information handling system 800 when the information handling system is otherwise shut down. An example of management device 890 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 890 may further include associated memory devices, logic devices, security devices, or the like, as needed, or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The invention claimed is:

1. An optical detector for use within a chassis of an information handling system, the optical detector comprising:

an internal illuminator configured to emit light to illuminate an object within a predetermined region of the chassis of the information handling system;

a photodetector configured to absorb the light across a color spectrum in response to the light being reflected from the object and to convert the light into an electrical signal; and a signal processor communicatively coupled with the photodetector to convert the electrical signal into coordinates of a predefined color space, wherein the coordinates correspond to a color of the object, and wherein the signal processor is configured to identify the object in response to the coordinates matching a predetermined set of coordinates associated with the object.

2. The optical detector of claim 1, wherein the information handling system is cooled by liquid cooling system, and wherein the signal processor is configured to detect a coolant leak from the liquid cooling system in response to the coordinates matching coordinates associated with a fluorescent dye added to a coolant circulated by the liquid cooling system.

3. The optical detector of claim 1, wherein the predefined color space is a CIE XYZW color space in which X, Y, Z, and W each correspond to a distinct color channel, and wherein the signal processor is configured to execute four back-to-back light measurements per cycle of the electrical signal according to an X-Y-Z-W order of measurements.

4. The optical detector of claim 3, wherein the signal processor is configured to detect a coolant leak within the information handling system, and wherein the optical detector is configured to detect the coolant leak by monitoring a counter and status register and by curtailing a current cycle and initiating a new cycle after measurement of the X, Y, and Z channels.

5. The optical detector of claim 1, wherein the signal processor is configured to analyze the electrical signal by sampling the electrical signal and performing digital signal processing of samples generated.

6. The optical detector of claim 5, wherein the signal processor is configured to generate N samples per cycle of the electrical signal by taking N/2 physical samples of the electrical signal and using the physical samples to estimate N minus N/2 additional samples.

7. The optical detector of claim 1, wherein the signal processor is configured to reject signals corresponding to non-correlated light and respond to signals corresponding to correlated light reflected from the object.

8. The optical detector of claim 7, wherein the signal processor is configured to distinguish between ultraviolet (UV) light emitted by the internal illuminator and fluorescent light reflected from a dye added to a coolant used by a liquid cooling system.

9. The optical detector of claim 7, wherein the signal processor is configured to distinguish between ambient light and fluorescent light reflected from a dye added to a coolant used by a liquid cooling system.

10. A method of detecting objects within a chassis of an information handling system, the method comprising:

illuminating an object within a predetermined region of the chassis with light emitted from a light source within the chassis;

absorbing the light, with a photodetector, in response to the light being reflected from the object and converting the light into an electrical signal; and converting the electrical signal, with a signal processor, into coordinates of a predefined color space, wherein the coordinates correspond to a color of the object; and identifying the object in response to the coordinates matching a predetermined set of coordinates associated with the object.

11. The method of claim 10, wherein the identifying comprises identifying a coolant leak from a liquid cooling system used to cool the information handling system and is in response to the coordinates matching coordinates associated with a fluorescent dye added to a coolant circulated by the liquid cooling system.

12. The method of claim 10, wherein the predefined color space is a CIE XYZW color space in which each of X, Y, Z, and W correspond to a distinct color channel, and wherein four back-to-back light measurements per cycle of the electrical signal are made with the signal processor according to an X-Y-Z-W order of measurements.

13. The method of claim 12, wherein the identifying comprises detecting a coolant leak within the information handling system, and wherein the coolant leak is detected by monitoring a counter and status register and by curtailing a current cycle and initiating a new cycle after measurement of the X, Y, and Z channels.

14. The method of claim 10, wherein the electrical signal is analyzed by the signal processor's sampling the electrical signal and performing digital signal processing of samples generated.

15. The optical detector of claim 14, wherein N samples are generated per cycle of the electrical signal, the N samples generated by taking N/2 physical samples of the electrical signal and using the physical samples to estimate N minus N/2 additional samples.

16. The method of claim 10, further comprising rejecting signals corresponding to non-correlated light and responding to signals corresponding to correlated light reflected from the object.

17. The method of claim 16, wherein the identifying comprises distinguishing between ultraviolet (UV) light emitted by the internal illuminator and fluorescent light reflected from a dye added to a coolant used by a liquid cooling system.

18. The method of claim 16, wherein the identifying comprises distinguishing between ambient light and fluorescent light reflected from a dye added to a coolant used by a liquid cooling system.

* * * * *